(12) United States Patent
Baik et al.

(10) Patent No.: US 8,247,031 B2
(45) Date of Patent: Aug. 21, 2012

(54) METHOD FOR GROWING THIN FILM

(75) Inventors: Young Joon Baik, Seoul (KR); Won Mok Kim, Seoul (KR); Kyeong Seok Lee, Pohang-si (KR); Jong-Keuk Park, Seoul (KR); Jeung-hyun Jeong, Seoul (KR); Suyoun Lee, Yongin-si (KR); Taek Sung Lee, Seoul (KR)

(73) Assignee: Korea Institute of Science and Technology (KR)

( * ) Notice: Subject to any disclaimer, the term of this patent is extended or adjusted under 35 U.S.C. 154(b) by 591 days.

(21) Appl. No.: 12/417,231

(22) Filed: Apr. 2, 2009

(65) Prior Publication Data
US 2009/0324824 A1    Dec. 31, 2009

(30) Foreign Application Priority Data
Jun. 27, 2008   (KR) ........................ 10-2008-0061513

(51) Int. Cl.
*C23C 16/00* (2006.01)
*B05D 1/36* (2006.01)
(52) U.S. Cl. ..................................... 427/255.7; 427/265
(58) Field of Classification Search .......................... None
See application file for complete search history.

(56) References Cited

FOREIGN PATENT DOCUMENTS
| | | |
|---|---|---|
| JP | 2000327491 | 11/2000 |
| KR | 1020050049692 | 5/2005 |

OTHER PUBLICATIONS

Fay et al "Low pressure chemical vapor deposition of ZnO layers for thin film solar cells: temperature induced morphological changes", Solar Energy material & Solar Cells, 86 (2005) 385-397.*
S. Fay et al., Rough ZnO layers by LP-CVD process and their effect in improving performances of amorphous and microcrystalline silicon solar cells, Solar Energy Materials & Solar Cells 90 (2006), Elsevier B.V., pp. 2960-2967.
S. Fay et al., Low pressure chemical vapour deposition of ZnO layers for thin-film solar cells: temperature-induced morphological changes, Solar Energy Materials & Solar Cells 86 (2005), Elsevier B.V., pp. 385-397.

* cited by examiner

*Primary Examiner* — Melvin C Mayes
*Assistant Examiner* — Bijay Saha
(74) *Attorney, Agent, or Firm* — Cantor Colburn LLP

(57) ABSTRACT

Disclosed is a method for growing a thin film, which includes modifying a surface grain size and surface roughness on a thin film to improve the mobility of a carrier and a light scattering effect. The method for growing a thin film includes: forming nuclei of grains having various grain orientations on a substrate; causing first grains having a first specific grain orientation to grow predominantly among the grains having various grain orientations, thereby forming a first preferred texture comprised of the predominantly grown first grains; and then causing second grains having a second grain orientation to grow predominantly, thereby forming a second preferred texture comprised of the predominantly grown second grains, wherein the surface grain size of each of the second grains forming the second texture is larger than that of each of the first grains forming the first texture.

7 Claims, 5 Drawing Sheets

(a)

(b)

(c)

(a)

(b)

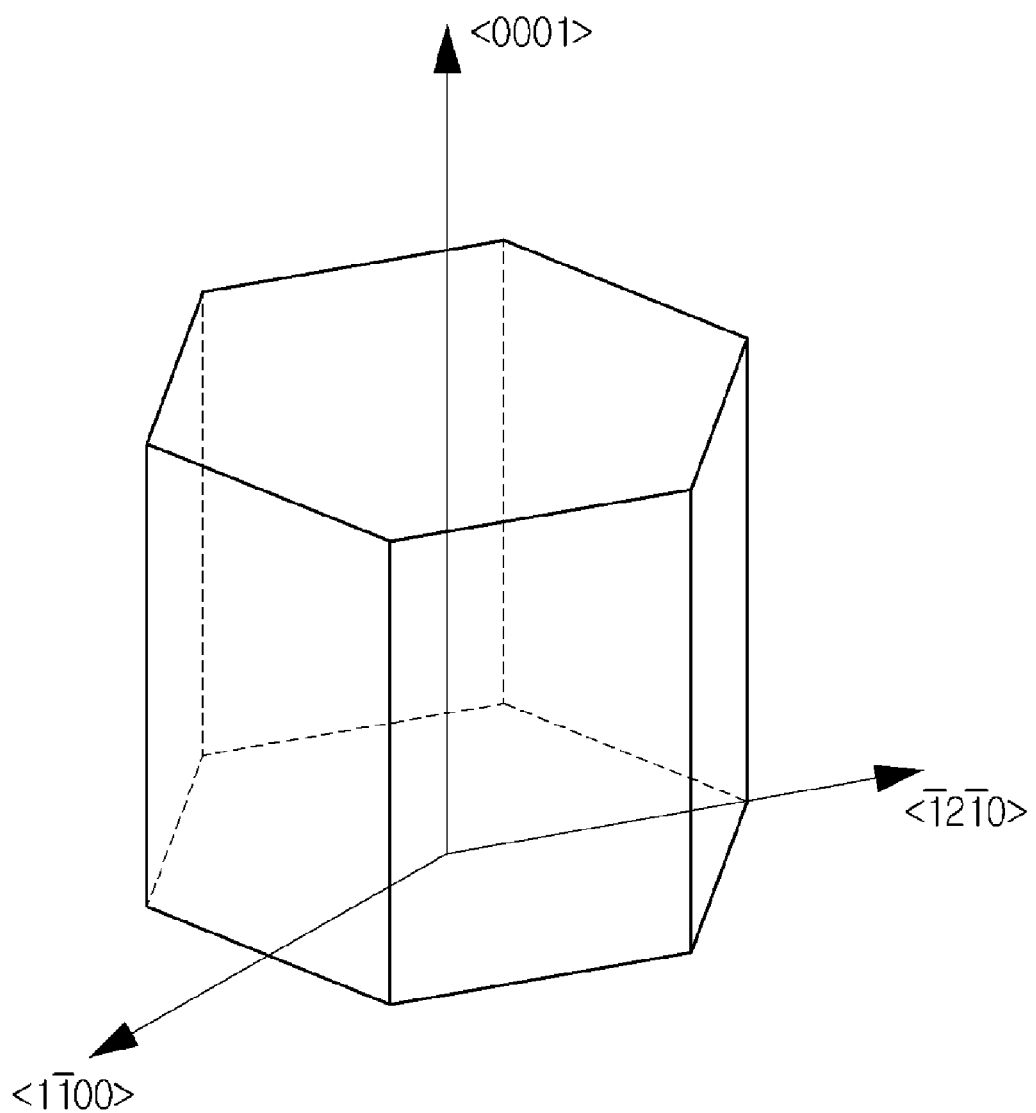
FIG. 4a (amended)

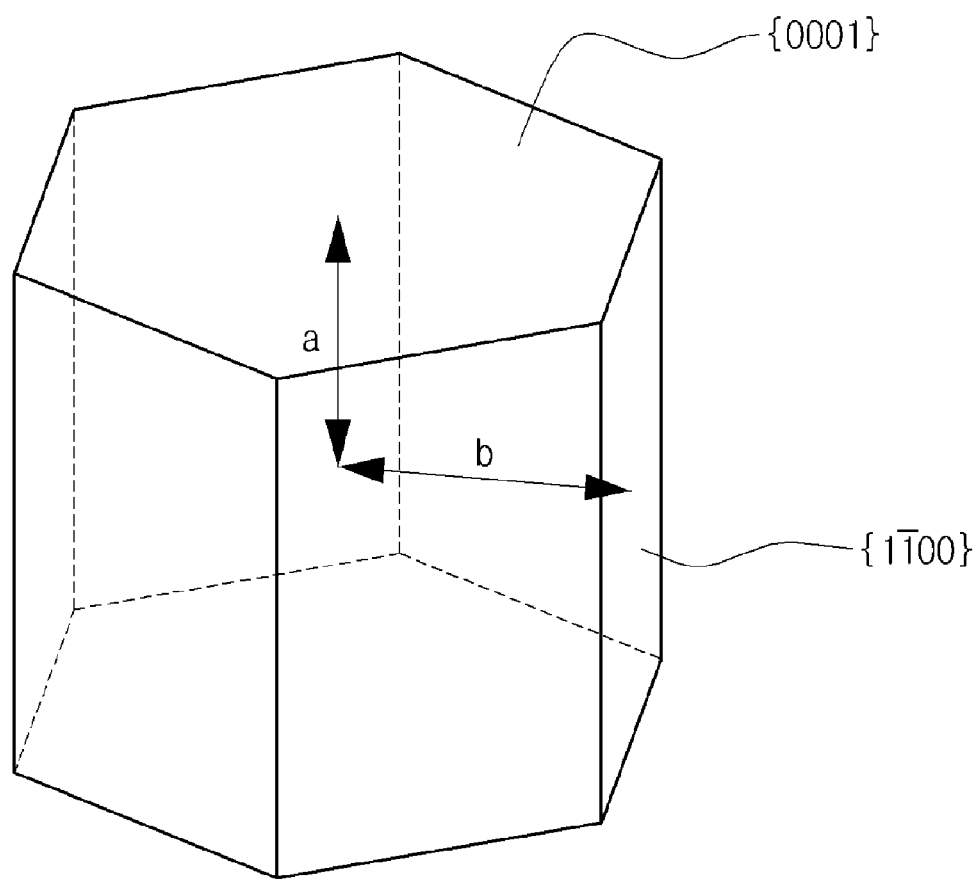
FIG. 4b (amended)

METHOD FOR GROWING THIN FILM

CROSS-REFERENCE TO RELATED APPLICATION

This application claims priority to Korean Patent Application No. 10-2008-0061513, filed on Jun. 27, 2008, and all the benefits accruing therefrom under 35 U.S.C. §119, the contents of which in its entirety are herein incorporated by reference.

BACKGROUND

1. Field

This disclosure relates to a method for growing a thin film. More particularly, this disclosure relates to a method for growing a thin film, which includes modifying a surface grain size and surface roughness on a thin film to improve the mobility of a carrier and a light scattering effect.

2. Description of the Related Art

In general, ZnO thin films are used as electrode materials for solar cells or flat panel display devices due to their excellent light transmission characteristics and conductivity. Such ZnO thin films are generally formed via a chemical vapor deposition (CVD) process or a physical vapor deposition (PVD) process such as sputtering. Various vapor deposition processes and physical properties of thin films obtained thereby are disclosed in many literatures.

Electrical and optical properties of ZnO thin films are significantly affected by the microstructures of the thin films. ZnO thin films have conductivity determined by the density and mobility of a carrier. Particularly, the density of a carrier is determined by crystal defects or doping levels, while the mobility of a carrier depends on light scattering that occurs during the movement of the carrier. In the case of a ZnO thin film, one of the most important factors affecting the mobility is to reduce the density at grain boundaries. Therefore, it is very important to reduce the density at grain boundaries by increasing the grain size of the thin film so that the thin film has improved conductivity.

Meanwhile, when a ZnO thin film is used in a thin film type solar cell, light confinement is required to increase a light transmission distance for the absorption of sunlight. To accomplish such light confinement, it is required to induce light scattering by increasing the surface roughness of a ZnO thin film. In the case of an $SnO_2$ thin film, micrometer ($\mu m$)-scale surface roughness is naturally obtained by the growth surface of growing grains. In contrast, this cannot be realized in the case of a ZnO thin film, because a ZnO thin film has a very small grain size and shows very low surface roughness as grains grow into (0001) surface. Therefore, ZnO thin films require a chemical etching process to ensure a certain degree of surface roughness. However, side effects may occur due to the chemical etching.

Meanwhile, thin films formed via a CVD or PVD process generally grow while forming a column-like grain structure. Column-like grains forming the column-like grain structure merely have a diameter of several tens nanometers (nm). Therefore, it is necessary to form large-diameter grains to improve conductivity or light confinement in various applications using ZnO.

The diameter of column-like grains increases as the thickness of a thin film increases. However, a ZnO thin film deposited via sputtering does not provide a sufficiently increased diameter of column-like grains even when the thickness of the thin film is increased. Thus, it is not expected in such ZnO films that the grain size is increased significantly. On the contrary, a ZnO thin film deposited via a CVD process provides an increased grain size as the result of an increase in the thickness. Particularly, it is shown that a thin film having a thickness of 8 $\mu m$ provides a surface grain size of about 1 $\mu m$, which is several tens of times greater than the surface grain size of a thin film formed via sputtering. However, ZnO thin films used in solar cells have a thickness of merely about 1-2 $\mu m$ in general. Therefore, when forming such ZnO thin films via a CVD process, the grain size is at most 1 $\mu m$.

In addition to the above-described sputtering process and CVD process, a method for controlling the grain size via surface treatment of a substrate may be considered. The method includes reducing the density of nuclei initially formed on the substrate during the growth of grains to increase the grain size. For example, it is theoretically possible to provide grains that form a thin film after vapor deposition with a surface grain size of 30 $\mu m$ or more, if a glass substrate is subjected to specific surface treatment by which nuclei are formed with an interval of 30 $\mu m$. However, nucleation of ZnO actually occurs at a high rate. Thus, the glass substrate requires surface treatment by which wetting with ZnO is inhibited in order to realize such a large surface grain size. Additionally, it is required to set a condition capable of minimizing driving force of deposition (e.g. supersaturation of deposition gas). However, even when such a condition is set, it results in a very low thin film growth rate. As a result, such surface treatment is not practical.

SUMMARY

Disclosed herein is a method for growing a thin film, which includes modifying a surface grain size and surface roughness on a thin film to improve the mobility of a carrier and a light scattering effect.

Disclosed also herein is a method for growing a thin film capable of modifying a surface grain size and surface roughness on a thin film under such conditions that minimize the thickness of a growing thin film, require no surface treatment of a substrate and cause no decrease in driving force of deposition.

In one aspect, there is provided a method for growing a thin film, which includes: forming grains having various grain orientations on a substrate; causing first preferred grains having a first specific grain orientation to grow predominantly among the grains having various grain orientations, thereby forming a first preferred texture comprised of the predominantly grown first preferred grains; and then causing second preferred grains having a second specific grain orientation to grow predominantly, thereby forming a second preferred texture comprised of the predominantly grown second grains, wherein the surface grain size of each of the second grains forming the second preferred texture is larger than the surface grain size of each of the first grains forming the first preferred texture before the onset of the second preferred texture growth.

In one embodiment of the method disclosed herein, before the first grains and the second grains grow predominantly, the interval between centers of the second grains is larger than the interval between centers of the first grains, And a shift in texture orientation from the first to the second is induced by varying thermodynamic process conditions. Herein, the thermodynamic process conditions may be at least one selected from temperature, pressure and addition of other chemical elements.

In another embodiment of the method disclosed herein, the method may be carried out via a chemical vapor deposition (CVD) process, and the thin film may be a ZnO thin film.

Herein, the first and the second texture orientation are different from each other, and the first and the second may be any one of <0001> orientation and <1̄ 2 1̄ 0> orientation respectively, in the case of a ZnO thin film.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 4a is a schematic view showing a hexagonal system with lattice orientations; and FIG. 4b is a schematic view showing a hexagonal system with Miller indices.

DETAILED DESCRIPTION

Figure 1:
FIG. 1 is a schematic view showing how textures of a thin film are formed.
Figure 1:
Figure 1:
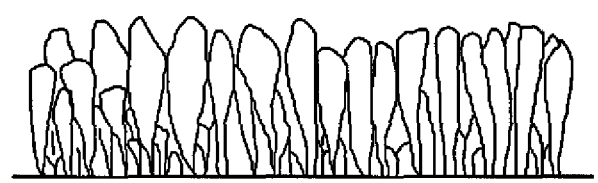

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

The method disclosed herein may be based on the evolutionary selection rule and the grain orientation filtering by texture growth. Hereinafter, a theoretical background of the evolutionary selection rule and application of the grain orientation filtering by texture growth derived from the background will be described in more detail.

Theoretical Background

When a thin film is formed to a predetermined thickness during the growth thereof, column-like grains are comprised of grains having a specific lattice orientation relative to the substrate, which is referred to as a texture. As shown in (a) of FIG. 1, at the beginning of the deposition of grains on a substrate, grains deposited on the substrate have random lattice orientations. However, as the deposition proceeds, growth of grains with a specific orientation predominates over growth of grains with the other orientations. Therefore, as shown in (b) of FIG. 1, grains with the other orientations stop their growth. Then, as shown in (c) of FIG. 1, grain growth is accomplished by the surviving grains, and the orientation of the surviving grains determines the texture orientation. Here, the texture orientation is determined by the evolutionary selection rule.

Figure 2:
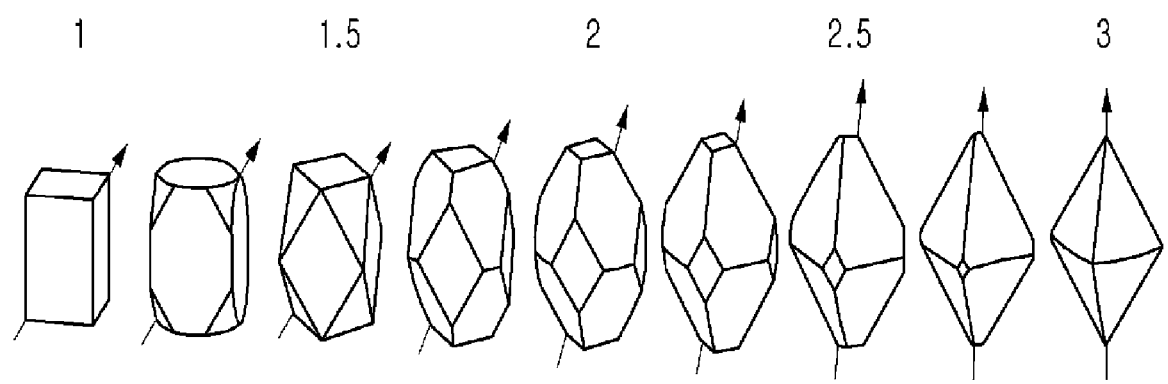
FIG. 2 is a schematic view showing variations in crystal shape depending on the relative growth rates of crystal surfaces.

The evolutionary selection rule is that the texture orientation during the growth of a thin film is determined by the orientation with the highest growth rate during the growth of single crystals. FIG. 2 shows the shape of grown single crystals and texture orientation determined by the growth rate of each crystal surface in the case of single crystals having a crystal structure with cubic symmetry. If the single crystal growth surface includes (111) surface (the triangular surface of the right-most octahedron in FIG. 2) and (100) surface (the square surface of the left-most cube in FIG. 2), the difference a between relative velocities of the growth of the two surfaces is conventionally defined as represented by the following equation, and the single grains grown with the value a has the shape as shown in FIG. 2:

$$a = \sqrt{3} V_{100}/V_{111}$$

wherein $V_{100}$ and $V_{111}$ represent the growth rates of (100) surface and (111) surface, respectively.

For example, when a is less than 1, i.e. when the growth rate of (111) surface is significantly higher than the growth rate of (100) surface, a single grain grown under such a condition has the shape of a cube whose growth surface is (100) surface. On the contrary, when a is greater than 1, i.e. when the growth rate of (111) surface is significantly lower than the growth rate of (100) surface, a single grain grown under such a condition has the shape of an octahedron whose growth surface is (111) surface.

Therefore, it can be seen that the shape of grown single crystals is determined by the crystal surface with a lower growth rate. Meanwhile, the texture orientation is determined by the orientation with the highest growth rate according to the evolutionary selection rule. Therefore, in the case of cube-shaped single crystals, the texture orientation becomes <111> orientation. In contrast, in the case of octahedron-shaped single crystals, the texture orientation becomes <100> orientation. Herein, when the texture orientation is <111> orientation, the grains grown to form a thin film have the shape of a cube, and thus the surface forming the thin film surface becomes (100) surface with the lowest growth rate, and (100) surface makes an angle with the texture orientation, <111> orientation. Therefore, it is possible to determine the growth rates in different orientations inversely from the aforementioned single crystal shape. In other words, the growth rate of each crystal surface is determined by the distance from the center of single crystals to the corresponding crystal surface. For example, in the case of cube-shaped single crystals, <111> orientation with the largest distance from the center of the single crystals has the highest growth rate. Meanwhile, in the case of octagonal-shaped single crystals, <100> orientation with the largest distance from the center of the single crystals has the highest growth rate. In the same manner, a single crystal having the shape of a dodecahedron shows the highest growth rate in <110> orientation.

As discussed above, a change in relative growth rate of different crystal surfaces allows the selection of predominantly growing grains, and such grains form a texture. In the method disclosed herein, the above-described principle of texture formation is applied to increase the surface grain size of a thin film, as well as to improve the surface roughness of a thin film.

Grain Orientation Filtering by Texture Growth

In the method disclosed herein, the orientation of growing grains during the growth of a thin film is varied in a stepwise manner to increase the size of the last predominantly growing grains and to improve the surface roughness of a thin film.

Figure 3:
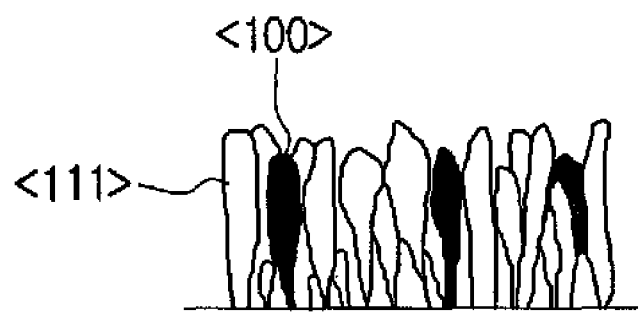
FIG. 3 is a schematic view illustrating the grain orientation filtering by texture growth according to one embodiment of the method disclosed herein.
Figure 3:
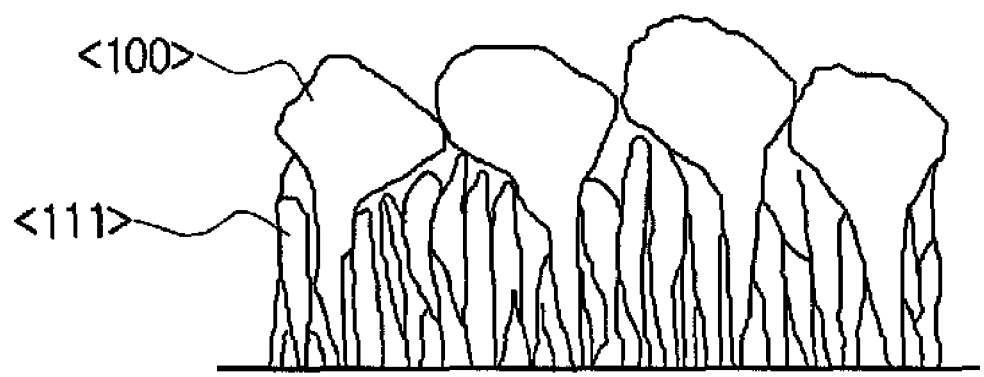

Referring to (a) of FIG. 3, grains with different orientations are formed on a substrate during the initial growth of a thin film. When the thin film is deposited to a predetermined thickness, a texture is formed and only the grains having a similar orientation to the texture orientation survive and grow continuously. For example, when the texture orientation is <111> orientation, most of the surviving grains are grains whose <111> orientation close to vertical direction of the substrate.

Under such conditions, when the texture orientation is changed into <100> orientation, grains whose <100> orientation is perpendicular to direction of the substrate grow predominantly, while most of the grains originally forming the texture are surrounded by the predominantly growing grains and are prevented from growing further.

Herein, as shown in (a) of FIG. 3, predominantly growing grains are distinguished from grains that stop growth. The dismissed grains are sparsely disposed on the substrate. Since the dismissed grains are spaced apart from each other, a broad growth space is provided between the grains. As a result, the aforementioned change in the texture orientation results in a significantly larger grain size as compared to the predominantly growing grains in (a) of FIG. 3.

More particularly, as shown in (b) of FIG. 3, when the texture orientation is changed from <111> orientation to <100> orientation by modifying the growth condition, the dismissed grains in (a) of FIG. 3 are disposed on the substrate at increased intervals, resulting in a significant increase of the grain size.

In the above BACKGROUND section, it is said that nucleation occurs at a high rate in the case of ZnO, and thus reduction of the nuclear density is not practically allowed. However, since the method as shown in FIG. 3 includes selection of predominantly growing grains in a stepwise manner regardless of the nuclear density, the last predominantly growing grains as a result of such selection show a low density on the substrate (i.e., the grains have a larger interval between them). Therefore, it is possible to increase the size of the last predominantly growing grains.

Meanwhile, it is to be noted that ZnO to be applied to the method disclosed herein does not have a system with cubic symmetry as shown in FIG. 3 but has a system with hexagonal symmetry. In the case of a system with hexagonal symmetry, the evolutionary selection rule and the grain orientation filtering by texture growth may be applied in the same manner. In other words, also in the case of a system with hexagonal symmetry, the shape of growing single crystals is determined by the relative growth rate of each crystal surface, and then the texture orientation is determined thereby.

FIG. 4a is a schematic view showing a hexagonal system with lattice orientations, and FIG. 4b is a schematic view showing a hexagonal system with Miller indices.

Referring to FIGS. 4a and 4b, the Miller index of a surface perpendicular to any one lattice orientation is the index of the corresponding lattice orientation.

As shown in FIGS. 4a and 4b, in the case of a system with hexagonal symmetry, the ratio a/b of the distance a between the center of single crystals and {0001} surface to the distance b between the center of single crystals and {1 $\bar{1}$ 00} surface becomes the relative ratio of growth rates. The length of the hexagonal column increases as the ratio a/b increases. Herein, the surface corresponding to each vertex has too high a growth rate to form the surface of growing grains, and thus disappears. If such grains form a thin film, the texture orientation becomes the orientation of the vertex with the highest growth rate. Based on this, it is estimated that the shape of growing single crystals of a ZnO thin film formed by sputtering is a very elongated shape. Additionally, the correct texture orientation in this case is not <0001> orientation but the orientation of the vertex where {0001} surface joins with two adjacent {1 $\bar{1}00$} surfaces. Therefore, {0001} surface forming the surface of the thin film is created with an inclination corresponding to the difference in angle (i.e., angular difference between <0001> orientation and the texture orientation) from the substrate. Meanwhile, as the length of the hexagonal column decreases, the difference in angle between <0001> orientation and the texture orientation increases, and the angle formed by {0001} surface and the substrate increases, thereby increasing the surface roughness of the thin film.

Hereinabove, the grain orientation filtering by texture growth in systems with cubic symmetry and hexagonal symmetry was described. As described above, the grain orientation filtering by texture growth includes varying the texture orientation in a stepwise manner to selectively control the grain size of the last predominantly growing grains. To realize such grain orientation filtering, it is prerequisite to enable a variation in the texture orientation.

To accomplish such variation in the texture orientation, the relative growth rate of a crystal surface may be varied. Growth of a crystal surface is determined by the binding rate of atoms that are in contact with the surface in case the crystal surface reaction determines the growth rate. The binding rate depends on the structure of the crystal surface. When the surface has a high density of dangling bonds, atoms coming from a vapor phase may have a larger number of sites where they form bonds, thereby increasing the growth rate. Therefore, the growth rate may be controlled by varying the crystal surface structure.

Since the surface binding structure depends on thermodynamic conditions, the crystal surface structure may be varied by controlling such parameters as temperature, pressure, gas composition and presence of impurities (i.e. addition of other chemical elements). Therefore, thermodynamic conditions may be varied to cause a variation in relative growth rates of lattice surfaces, which ultimately leads to a variation in the texture orientation.

As mentioned above, the above-described method for growing a thin film includes varying the texture orientation in a stepwise manner to induce a decrease in distribution density of the last predominantly growing grains, thereby ensuring a relatively larger space for the growth of the corresponding grains. By doing so, it is possible to increase the grain size on the thin film surface and to improve the surface roughness. As a result, it is possible to improve the mobility of a carrier and a light scattering effect in the thin film.

The above-described method for growing a thin film is realized via the grain orientation filtering by texture growth, i.e., by varying the texture orientation in a stepwise manner to selectively control the grain size of the last predominantly growing grains. Herein, variations in the texture orientation mean variations in the relative growth rate of a crystal surface. Particularly, the relative growth rate of a crystal surface may be varied by modifying the thermodynamic conditions including temperature, pressure, gas composition, or the like. In other words, variations in the texture orientation are accomplished by modifying the thermodynamic process conditions. By doing so, it is possible to control the last predominantly growing grains.

EXAMPLES

The examples will now be described. The following examples are for illustrative purposes only and not intended to limit the scope of this disclosure.

Example 1

Diethylzinc (DEZ) and ethanol are used as precursors, and a ZnO thin film is formed therefrom to a thickness of 2 μm on a glass substrate at a temperature of 170° C. under ambient pressure via a chemical vapor deposition (CVD) process. The ZnO thin film deposited on the glass substrate is analyzed via X-ray diffractometry. After the analysis, it is shown that the texture orientation is <0001> orientation. It is observed by scanning electron microscopy (SEM) of the section of the thin film that the thin film includes a column-like texture. In addition, it is observed that the surface grain size increases in proportion to the thickness of grains. However, the thin film has a surface roughness of merely several tens of nanometers.

Example 2

In this example, various process temperature conditions are applied under a constant pressure during the deposition of a ZnO thin film via a CVD process to investigate the texture orientation in each condition.

Particularly, DEZ and ethanol are used as precursors, and ZnO thin films are formed therefrom to a thickness of 2-2.5 μm on a substrate at a temperature of 130° C. and 180° C. under a pressure of 0.5 mbar via a CVD process.

After observing the section of the deposited thin film via SEM, grains with random growth orientations are deposited. Then, predominantly growing grains gradually form a texture. At this time, the texture is formed at a thickness of about 300-400 nm. In addition, the diameter of grains increases as the growth of the thin film proceeds. The ZnO thin film formed in this example has a larger grain size as compared to the ZnO thin film formed via a CVD process under ambient pressure.

Meanwhile, after analyzing the ZnO thin film formed at a process temperature of 130° C. via X-ray diffractometry, it is shown that the texture orientation is <0001> orientation. On the other hand, it is shown that the texture orientation of the ZnO thin film formed at a process temperature of 180° C. is <$\bar{1}\,2\,\bar{1}\,0$> orientation. As can be seen from the above results, the texture orientation is varied depending on the process temperature condition.

In addition, the ZnO thin film formed at a process temperature of 130° C. shows a surface grain size of about 0.3 μm at a thickness of 2 μm, and has a surface roughness of approximately 40 nm through the texture formation with <0001> texture orientation. Meanwhile, the ZnO thin film formed at a process temperature of 180° C. shows a surface grain size of about 0.6 μm at a thickness of 2.5 μm, and has a surface roughness of approximately 600 nm.

Example 3

In this example, a ZnO thin film is formed via a CVD process under a constant pressure by varying the process temperature in a time-serial manner to induce variations in the texture orientation.

First, a ZnO thin film is formed to a thickness of 1 μm at a process temperature of 130° C. in the same manner as described in Example 2 (including precursors and other process parameters such as a pressure of 0.5 mbar). In the ZnO thin film formed in the above manner, the texture orientation is <0001> orientation. Then, an additional ZnO thin film is formed on the ZnO thin film to a thickness of 2 μm at a temperature of 180° C.

After the thin films are analyzed via X-ray diffractometry, both <0001> texture orientation and <$\bar{1}\,2\,\bar{1}\,0$> texture orientation are observed. This suggests that the texture with <0001> texture orientation is formed first, and then the texture with <$\bar{1}\,2\,\bar{1}\,0$> texture orientation is formed. It is shown in the cross-section SEM that the thin films have a texture very similar to the texture as shown in (b) of FIG. 3 and the surface grains include grains having a size of at least several micrometers. In addition, the surfaces of the thin films have a surface roughness similar to the grain size due to the growth surfaces of the grains.

Example 4

In this example, a ZnO thin film is formed via a CVD process under a constant temperature by varying the process pressure in a time-serial manner to induce variations in the texture orientation.

First, a ZnO thin film is formed to a thickness of 1 μm under ambient pressure in the same manner as described in Example 1 (including precursors and other process parameters such as a process temperature of 170° C.). Then, an additional ZnO thin film is formed on the ZnO thin film to a thickness of 2 μm under a pressure of 0.5 mbar.

After the thin films are analyzed via X-ray diffractometry, both <0001> texture orientation and <$\bar{1}\,2\,\bar{1}\,0$> texture orientation are observed. However, the peak intensity of <0001> orientation is relatively lower as compared to Example 3. The surface grain size and shape as well as the shapes of broken surfaces are similar to the results of Example 3.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A method for growing a thin film, which includes:
    forming grains having various grain orientations on a substrate;
    causing first grains having a first grain orientation to grow predominantly among the grains having various grain orientations, thereby forming a first texture comprised of the predominantly grown first grains;

causing second grains having a second grain orientation to grow predominantly after the first texture is formed, thereby forming a second texture comprised of the predominantly grown second grains on the first texture, where the second grain orientation is different from the first grain orientation; and wherein the average surface grain size of each of the second grains forming the second texture is larger than that of each of the first grains forming the first texture.

2. The method for growing a thin film according to claim 1, wherein an interval between centers of the second grains is larger than an interval between centers of the first grains, before the first grains and the second grains grow predominantly.

3. The method for growing a thin film according to claim 1, wherein a shift from the first texture orientation to the second texture orientation is induced by varying thermodynamic process conditions.

4. The method for growing a thin film according to claim 3, wherein the thermodynamic process condition is at least one selected from pressure and addition of other chemical elements.

5. The method for growing a thin film according to claim 4, which is carried out via a chemical vapor deposition (CVD) process.

6. The method for growing a thin film according to claim 1, wherein the thin film is a ZnO thin film.

7. The method for growing a thin film according to claim 6, wherein the first and the second texture orientation are different from each other, being any one of <0001> orientation and <$\bar{1}\,2\,\bar{1}\,0$> orientation respectively.

* * * * *